(12) United States Patent
Lee et al.

(10) Patent No.: US 7,088,628 B2
(45) Date of Patent: Aug. 8, 2006

(54) MEMORY DEVICE AND METHOD OF AMPLIFYING VOLTAGE LEVELS OF BIT LINE AND COMPLEMENTARY BIT LINE

(75) Inventors: Byung-jae Lee, Yongin-si (KR); Gyu-hong Kim, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 105 days.

(21) Appl. No.: 10/829,133

(22) Filed: Apr. 21, 2004

(65) Prior Publication Data
US 2005/0030805 A1 Feb. 10, 2005

(30) Foreign Application Priority Data
Aug. 8, 2003 (KR) ............. 10-2003-0055034

(51) Int. Cl.
*G11C 7/00* (2006.01)
(52) U.S. Cl. .............. 365/205; 365/203; 365/207
(58) Field of Classification Search ............... None
See application file for complete search history.

(56) References Cited

U.S. PATENT DOCUMENTS 6,590,819 B1 * 7/2003 Baum et al. ............... 365/203

* cited by examiner

*Primary Examiner*—David Lam
(74) *Attorney, Agent, or Firm*—Mills & Onello LLP (57) ABSTRACT

When first memory cells connected to a bit line are selected, the bit-line sense amplifier amplifies the voltage levels of the bit line and the complementary bit line using the first current path and the second current path, wherein the first current path is formed between the output node of the sensing enable unit and the bit line in response to the voltage level of the complementary bit line and the first addressing signal, and the second current path is formed between the output node of the sensing enable unit and the complementary bit line in response to the voltage level of the bit line and the second addressing signal.

16 Claims, 5 Drawing Sheets

MEMORY DEVICE AND METHOD OF AMPLIFYING VOLTAGE LEVELS OF BIT LINE AND COMPLEMENTARY BIT LINE

BACKGROUND OF THE INVENTION

This application claims the priority of Korean Patent Application No. 2003-55034, filed on Aug. 8, 2003, in the Korean Intellectual Property Office, the contents of which are incorporated herein in their entirety by reference.

1. Field of the Invention

The present invention relates to a semiconductor memory device, and specifically to a memory device employing a bit-line sense amplifier with an arbitrary sensing directionality by a gate bias control, and a method of amplifying voltage levels of a bit line and a complementary bit line of a memory device.

2. Description of the Related Art

In general, since dynamic random access memory (DRAM) cells do not have self amplification ability, memory cell data are sensed using bit-line sense amplifiers connected to the memory cells during read-out operation. The bit-line sense amplifiers sense and amplify a voltage difference of about 100 mV through 250 mV generated due to charge distribution in the bit lines.

A method of pre-charging bit lines and complementary bit lines to a power source voltage VDD level, and then sensing and amplifying cell data in connection with bit-line sense amplifiers of DRAMs has been disclosed. In this case, since the charge distribution does not occur in the bit lines when the cell data is "1", the voltage difference is not generated between the bit lines and the complementary bit lines, so that it is not possible to sense the cell data. As a solution for this problem, a reference cell pre-charged to a VDD/2 level is provided to drop the voltage level of the complementary bit lines and generate the voltage difference between the bit lines and the complementary bit lines, so that it is possible to sense the cell data.

Another method of pre-charging the bit lines and the complementary bit lines to a ground voltage VSS level, and then sensing and amplifying the cell data in a bit-line sense amplifier has been disclosed. In this case, since the charge distribution does not occur in the bit lines pre-charged to the ground voltage VSS when the cell data is "0", it is not possible to sense the cell data, so that a reference cell pre-charged to a VDD/2 level is required for sensing the cell data.

Figure 1:
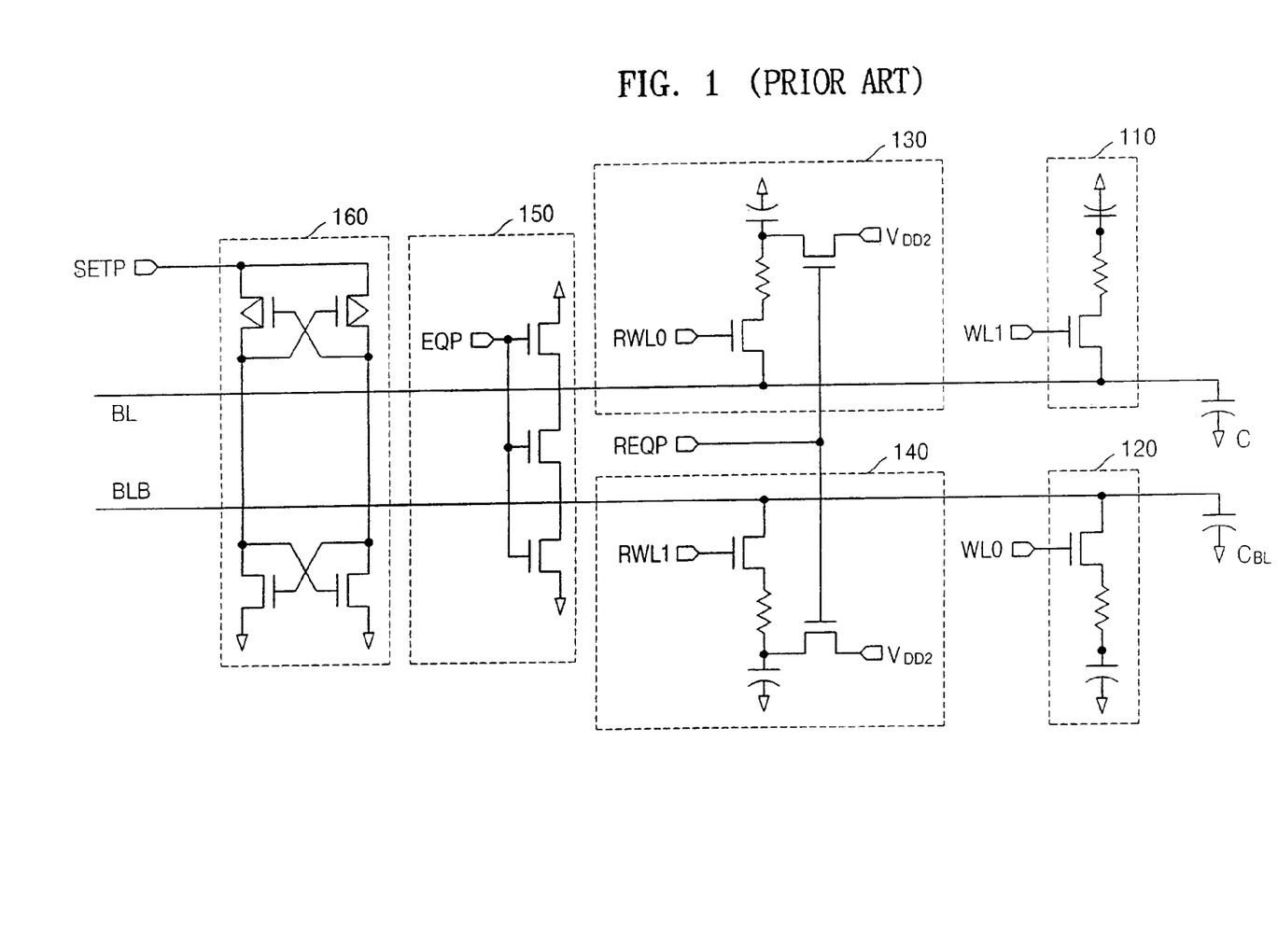
FIG. 1 illustrates a memory device including a conventional bit-line sense amplifier.

FIG. 1 is a circuit diagram illustrating a conventional bit-line sense amplifier. Referring to FIG. 1, a first memory cell 110 and a first reference cell 130 are connected to a bit line BL, and a second memory cell 120 and a second reference cell 140 are connected to a complementary bit line BLB. A bit-line equalization circuit 150 is connected between the bit line BL and the complementary bit line BLB. When a word line WL1 of the first memory cell 110 is enabled, data of the first memory cell 110 is transferred to the bit line BL, and the data of the first memory cell 110 is sensed and amplified by means of a bit-line sense amplifier 160 which senses a voltage difference between the bit line BL and the complementary bit line BLB. At this time, a word line RWL1 of the second reference cell 140 connected to the complementary bit line BLB is enabled, and a voltage level corresponding to a half of the power source voltage VDD, that is, a voltage level of VDD/2, is supplied to the complementary bit line BLB. Accordingly, the bit-line sense amplifier 160 senses a voltage level of the bit line BL by using the voltage level of VDD/2 of the complementary bit line BLB as a reference.

However, addition of the reference cells may cause the size of a memory chip to increase. In addition, when the reference cells have defects, a design technology for repairing the defective reference cells may be complex. Therefore, bit-line sense amplifiers capable of working without reference cells have been required.

SUMMARY OF THE INVENTION

The present invention provides a bit-line sense amplifier having a predetermined sensing directionality on a bit line and a complementary bit line in sensing memory cell data without a reference cell.

The present invention also provides a bit-line sensing method in which a predetermined sensing directionality is provided on a bit line and a complementary bit line.

According to an aspect of the present invention, there is provided a memory device comprising: first memory cells connected to a bit line; second memory cells connected to a complementary bit line; a bit-line equalization circuit which pre-charges the bit line and the complementary bit line to a power source voltage level; a sensing enable unit which changes the voltage at its output node to a ground voltage level in response to a sensing enable signal; and a bit-line sense amplifier in which when the first memory cells connected to the bit line are selected, a second addressing signal for selecting the second memory cells connected to the complementary bit line is generated with a voltage level higher than that of a first addressing signal for selecting the first memory cells connected to the bit line, thereby amplifying a voltage level of the bit line and a voltage level of the complementary bit line using a first current path and a second current path, wherein the first current path is formed between the output node of the sensing enable unit and the bit line in response to the voltage level of the complementary bit line and the first addressing signal, and the second current path is formed between the output node of the sensing enable unit and the complementary bit line in response to the voltage level of the bit line and the second addressing signal.

When the second memory cells connected to the complementary bit line are selected, the first addressing signal may be generated with a voltage level higher than that of the second addressing signal, thereby amplifying the voltage level of the bit line and the voltage level of the complementary bit line using the first current path and the second current path.

In one embodiment, the sensing enable unit is an inverter comprising a PMOS transistor and an NMOS transistor connected in series between the power source voltage and the ground voltage, the gates of the PMOS and NMOS transistors being supplied with the sensing enable signal.

The bit-line sense amplifier may comprise: a first PMOS transistor the source of which is supplied with the power source voltage, the drain of which is connected to the bit line, and the gate of which is connected to the complementary bit line; a second PMOS transistor the source of which is supplied with the power source voltage, the drain of which is connected to the complementary bit line, and the gate of which is connected to the bit line; first and second NMOS transistors connected in series between the bit line and the output node of the sensing enable unit, the gate of the first NMOS transistor being supplied with a first control signal which is activated when the memory cells connected to the complementary bit line are selected, the gate of the second NMOS transistor being connected to the complementary bit line; and third and fourth NMOS transistors connected in series between the complementary bit line and the output node of the sensing enable unit, the gate of the third NMOS transistor being supplied with a second control signal which is activated when the memory cells connected to the bit line are selected, the gate of the fourth NMOS transistor being connected to the bit line.

The first control signal may be generated from a first control signal generating circuit, and the first control signal generating circuit may comprise: a first PMOS transistor the source of which is supplied with a first source voltage having a voltage level higher than a second source voltage, and the gate of which is supplied with an inverted signal of the second addressing signal; a second PMOS transistor the source of which is supplied with the second source voltage, and the gate of which is supplied with the first addressing signal; and an NMOS transistor the source of which is supplied with the ground voltage, the gate of which is supplied with the sensing enable signal, and the drain of which is connected to the drains of the first and second PMOS transistors.

The second control signal may be generated from a second control signal generating circuit, and the second control signal generating circuit may comprise: a first PMOS transistor the source of which is supplied with the first source voltage having a voltage level higher than a second source voltage, and the gate of which is supplied with the second addressing signal; a second PMOS transistor the source of which is supplied with the second source voltage, and the gate of which is supplied with an inverted signal of the first addressing signal; and an NMOS transistor the source of which is supplied with the ground voltage, the gate of which is supplied with the sensing enable signal, and the drain of which is connected to the drains of the first and second PMOS transistors.

According to another aspect of the present invention, there is provided a memory device comprising: first memory cells connected to a bit line; second memory cells connected to a complementary bit line; a bit-line equalization circuit which pre-charges the bit line and the complementary bit line to a ground voltage level; a sensing enable unit which changes the voltage at its output node to a power source voltage level in response to a sensing enable signal; and a bit-line sense amplifier in which when the first memory cells connected to the bit line are selected, a second addressing signal for selecting the second memory cells connected to the complementary bit line is generated with a voltage level lower than that of a first addressing signal for selecting the first memory cells connected to the bit line, thereby amplifying a voltage level of the bit line and a voltage level of the complementary bit line using a first current path and a second current path, wherein the first current path is formed between the output node of the sensing enable unit and the bit line in response to the voltage level of the complementary bit line and the first addressing signal, and the second current path is formed between the output node of the sensing enable unit and the complementary bit line in response to the voltage level of the complementary bit line and the second addressing signal.

When the second memory cells connected to the complementary bit line are selected, the first addressing signal may be generated with a voltage level lower than that of the second addressing signal, thereby amplifying the voltage level of the bit line and the voltage level of the complementary bit line using the first current path and the second current path.

In one embodiment, the sensing enable unit is an inverter comprising a PMOS transistor and an NMOS transistor connected in series between the power source voltage and the ground voltage, the gates of the PMOS and NMOS transistors being supplied with the sensing enable signal.

The bit-line sense amplifier may comprise: a first NMOS transistor the source of which is supplied with the ground voltage, the drain of which is connected to the bit line, and the gate of which is connected to the complementary bit line; a second NMOS transistor the source of which is supplied with the power source voltage, the drain of which is connected to the complementary bit line, and the gate of which is connected to the bit line; first and second PMOS transistors connected in series between the bit line and the output node of the sensing enable unit, the gate of the first PMOS transistor being supplied with a first control signal which is activated when the memory cells connected to the complementary bit line are selected, the gate of the second PMOS transistor being connected to the complementary bit line; and third and fourth PMOS transistors connected in series between the complementary bit line and the output node of the sensing enable unit, the gate of the third PMOS transistor being supplied with a second control signal which is activated when the memory cells connected to the bit line are selected, the gate of the fourth PMOS transistor being connected to the bit line.

The first control signal may be generated from a first control signal generating circuit, and the first control signal generating circuit may comprise: a first NMOS transistor the source of which is supplied with a second ground voltage having a voltage level lower than a first ground voltage, and the gate of which is supplied with the second addressing signal; a second NMOS transistor the source of which is supplied with the first ground voltage, and the gate of which is supplied with the inverted first addressing signal; and a PMOS transistor the source of which is supplied with the power source voltage, the gate of which is supplied with the inverted sensing enable signal, and the drain of which is connected to the drains of the first and second NMOS transistors.

The second control signal may be generated from a second control signal generating circuit, and the second control signal generating circuit may comprise: a first NMOS transistor the source of which is supplied with a second ground voltage having a voltage level lower than a first ground voltage, and the gate of which is supplied with the second addressing signal; a second NMOS transistor the source of which is supplied with the first ground voltage, and the gate of which is supplied with an inverted signal of the first addressing signal; and a PMOS transistor the source of which is supplied with the power source voltage, the gate of which is supplied with the inverted sensing enable signal, and the drain of which is connected to the drains of the first and second NMOS transistors.

According to still another aspect of the present invention, there is provided a method of amplifying voltage levels of a bit line and a complementary bit line of a memory device, the method comprising: (a) pre-charging the bit line and the complementary bit line to a power source voltage level; (b) enabling first memory cells connected to the bit line to transfer data of the first memory cells to the bit line; and (c) allowing an output node of a sensing enable unit to have a ground voltage level in response to a sensing enable signal, wherein step (b) comprises: (b-1) generating a second addressing signal for selecting the second memory cells connected to the complementary bit line with a voltage level higher than that of a first addressing signal for selecting the first memory cells; and (b-2) amplifying the voltage level of the bit line and the voltage level of the complementary bit line using a first current path and a second current path, the first current path being formed between the output node of the sensing enable unit and the bit line in response to the voltage level of the complementary bit line and the first addressing signal, the second current path being formed between the output node of the sensing enable unit and the complementary bit line in response to the voltage level of the bit line and the second addressing signal.

The method may further comprise (d) enabling second memory cells connected to the complementary bit line to transfer data of the second memory cells to the complementary bit line, and step (d) may comprise: (d-1) generating the first addressing signal with a voltage level higher than that of the second addressing signal; and (d-2) amplifying the voltage level of the bit line and the voltage level of the complementary bit line by using the first current path and the second current path.

According to still another aspect of the present invention, there is provided a method of amplifying voltage levels of a bit line and a complementary bit line of a memory device, the method comprising: (a) pre-charging the bit line and the complementary bit line to a ground voltage level; (b) enabling first memory cells connected to the bit line to transfer data of the first memory cells to the bit line; and (c) allowing an output node of a sensing enable unit to have a power source voltage level in response to a sensing enable signal, wherein step (b) comprises: (b-1) generating a second addressing signal for selecting the second memory cells connected to the complementary bit line with a voltage level lower than that of a first addressing signal for selecting the first memory cells; and (b-2) amplifying the voltage level of the bit line and the voltage level of the complementary bit line using a first current path and a second current path, the first current path being formed between the output node of the sensing enable unit and the bit line in response to the voltage level of the complementary bit line and the first addressing signal, the second current path being formed between the output node of the sensing enable unit and the complementary bit line in response to the voltage level of the bit line and the second addressing signal.

The method may further comprise (d) enabling second memory cells connected to the complementary bit line to transfer data of the second memory cells to the complementary bit line, and step (d) may comprise: (d-1) generating the first addressing signal with a voltage level lower than that of the second addressing signal; and (d-2) amplifying the voltage level of the bit line and the voltage level of the complementary bit line by using the first current path and the second current path.

Therefore, according to the present invention, a directionality allowing the complementary bit line to turn into a voltage level opposite to cell data in sensing data of the memory cells connected to the bit line is provided, thereby making conventional reference cells unnecessary.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 2:
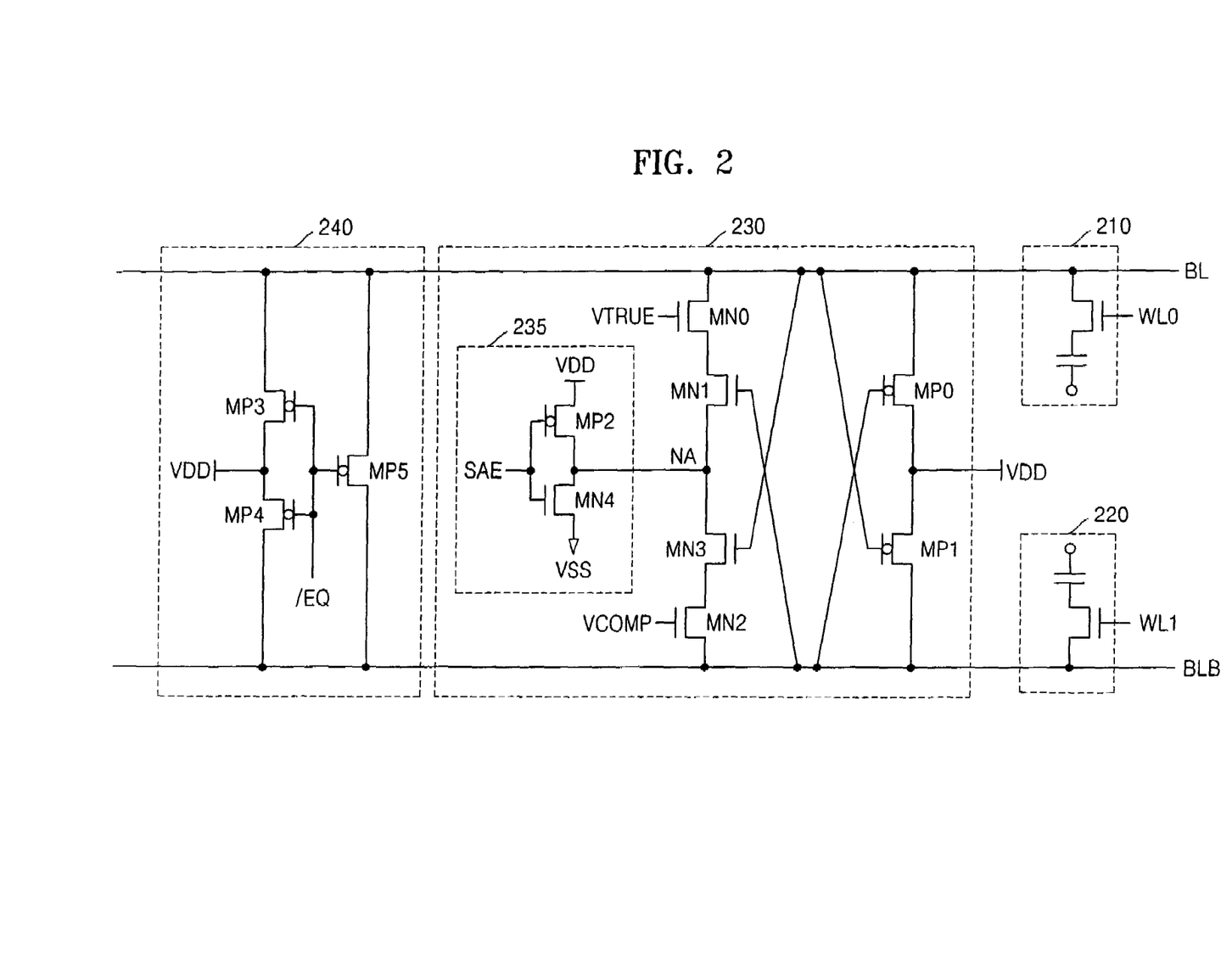
FIG. 2 illustrates a bit-line sense amplifier according to a first embodiment of the present invention.

FIG. 2 is a circuit diagram illustrating a bit-line sense amplifier according to a first embodiment of the present invention. In FIG. 2, a bit-line sense amplifier 230 and a bit-line equalization circuit 240 are connected between a bit line BL to which a first memory cell 210 is connected and a complementary bit line BLB to which a second memory cell 220 is connected. In one embodiment, the first and second memory cells 210 and 220 are dynamic random access memory (DRAM) cells having one transistor and one capacitor, respectively.

The bit-line sense amplifier 230 comprises first and second PMOS transistors MP0 and MP1 the sources of which are supplied with a power source voltage VDD and the drains of which are connected to the bit line BL and the complementary bit line BLB, respectively, a sensing enable unit 235 which responds to a sense amplifier enable signal SAE, first and second NMOS transistors MN0 and MN1 connected in series between the bit line BL and an output node NA of the sensing enable unit 235, and third and fourth NMOS transistors MN2 and MN3 connected in series between the complementary bit line BLB and the output node NA of the sensing enable unit 235. The sensing enable unit 235 comprises an inverter to which the sense amplifier enable signal SAE is input. The gates of the first PMOS transistor MP0 and the second NMOS transistor MN1 are connected to the complementary bit line BLB, and the gates of the second PMOS transistor MP1 and the fourth NMOS transistor MN3 are connected to the bit line BL. The gate of the first NMOS transistor MN0 is supplied with a first control signal VTRUE, and the gate of the third NMOS transistor MN2 is supplied with a second control signal VCOMP.

In the bit-line sense amplifier 230, corresponding to the selected memory cell, the first control signal VTRUE is generated with a voltage level higher than that of the second control signal VCOMP, or the second control signal VCOMP is generated with a voltage level higher than that of the first control signal VTRUE, and the output node NA of the sensing enable unit 235 becomes a ground voltage VSS level in response to activation of the sensing enable signal SAE to a logic high level, so that voltage levels of the bit line BL and the complementary bit line BLB are amplified.

The bit-line equalization circuit 240 comprises fourth and fifth PMOS transistors MP3 and MP4 the sources of which are supplied with the power source voltage VDD and the drains are connected to the bit line BL and the complementary bit line BLB, respectively, and a sixth PMOS transistor MP5 connected between the bit line BL and the complementary bit line BLB. The gates of the fourth, fifth and sixth PMOS transistors MP3, MP4 and MP5 are supplied with an equalizing signal /EQ. The bit line BL and the complementary bit line BLB are pre-charged to the power source voltage VDD level in response to activation of the equalizing signal /EQ into a logic low level.

The bit-line sense amplifier 230 according to this embodiment operates in accordance with the following. First, the bit line BL and the complementary bit line BLB are pre-charged to the power source voltage VDD level by means of the bit-line equalization circuit 240.

IN a case where data stored in the first memory cell 210 is a logic "1", when the first word line WL0 is enabled, the data "1" of the first memory cell 210 is transferred to the bit line BL, so that the bit line BL holds the power source voltage VDD level. The second control signal VCOMP is activated to a first source voltage VDDH level to turn on the third NMOS transistor MN2, and the first control signal VTRUE is activated to a second source voltage VDDL level to turn on the first NMOS transistor MN0. The first source voltage VDDH has a voltage level higher than the second source voltage VDDL. For example, if the second source voltage VDDL level is the power source voltage VDD level, the first source voltage VDDH means a high voltage VPP in the memory device or an external power source voltage corresponding to the high voltage VPP level. In this embodiment, it is assumed that the first source voltage VDDH is set to the high voltage VPP level, and the second source voltage VDDL is set to the power source voltage VDD level. If the second source voltage VDDL has a voltage level lower than the power source voltage VDD, it will be readily understood by those skilled in the art that the first source voltage VDDH can be set to the power source voltage VDD level.

The output node NA of the sensing enable unit 235 turns into the ground voltage VSS level in response to activation of the sensing enable signal SAE to a logic high level. In response to the power source voltage VDD level of the bit line BL, the fourth NMOS transistor MN3 is turned on, and the third NMOS transistor MN2 the gate of which is supplied with the high voltage VPP level is turned on, so that an intensive current path toward the output node NA of the sensing enable unit 235 having the ground voltage VSS level is formed from the complementary bit line BLB. Accordingly, the complementary bit line BLB is dropped to the ground voltage VSS level to turn off the second NMOS transistor MN1. Therefore, the bit line BL holds the power source voltage VDD level, and the complementary bit line BLB turns into the ground voltage VSS level, so that a voltage difference between the bit line BL and the complementary bit line BLB becomes large.

In a case where data stored in the first memory cell 210 is a logic "0", when the first word line WL0 is enabled, the data "0" of the first memory cell 210 is transferred to the bit line BL. The second control signal VCOMP is activated to the first source voltage VDDH level to turn on the third NMOS transistor MN2, and the first control signal VTRUE is activated to the second source voltage VDDL level to turn on the first NMOS transistor MN0. Thereafter, in response to activation of the sensing enable signal SAE to a logic high level, the output node NA of the sensing enable unit 235 turns into the ground voltage VSS level.

The voltage level of the bit line BL is slightly dropped from the power source voltage VDD level due to the cell data "0" transferred to the bit line BL. Accordingly, the fourth NMOS transistor MN3 is slightly turned on, and the second NMOS transistor MN1 of which the gate is connected to the complementary bit line BLB pre-charged to the power source voltage VDD level is turned on, so that an intensive current path toward the output node NA of the sensing enable unit 235 having the ground voltage VSS level through the turned-on first NMOS transistor MN0 and second NMOS transistor MN1 from the bit line BL is formed. Therefore, the bit line BL turns into the ground voltage VSS level to turn off the fourth NMOS transistor MN3, so that the bit line BL turns into the ground voltage VSS and the complementary bit line BLB turns into the power source voltage VDD level. As a result, a voltage difference between the bit line BL and the complementary bit line BLB becomes large.

Figure 3:
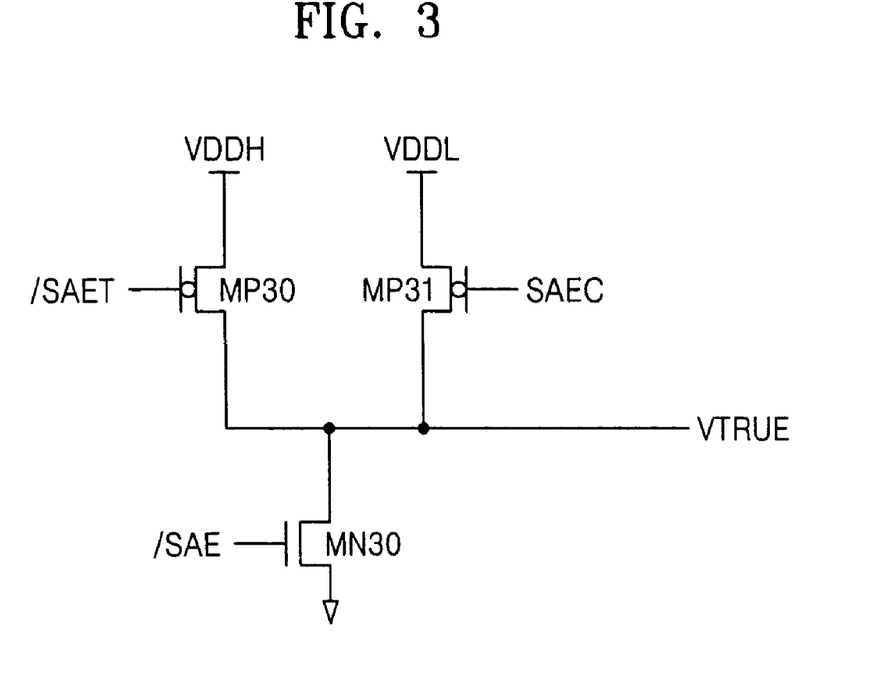
FIG. 3 illustrates a first control signal generating circuit for operating the bit-line sense amplifier shown in FIG. 2.
Figure 4:
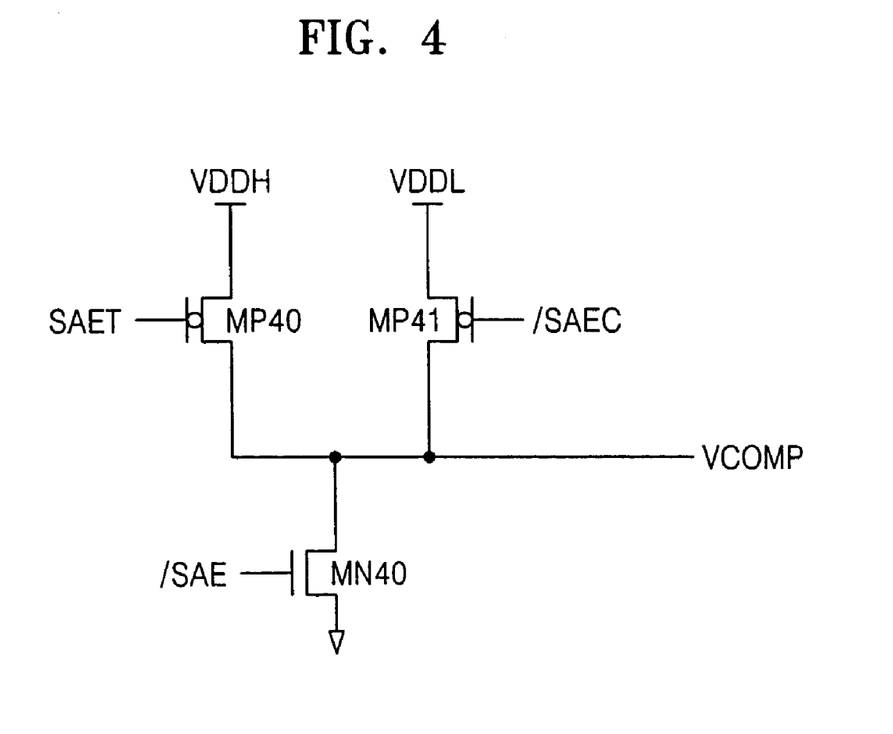
FIG. 4 illustrates a second control signal generating circuit for operating the bit-line sense amplifier shown in FIG. 2.

The first control signal VTRUE and the second control signal VCOMP are supplied from control signal generating circuits shown in FIGS. 3 and 4, respectively.

FIG. 3 shows a first control signal (VTRUE) generating circuit, which comprises a first PMOS transistor MP30 the source of which is supplied with the first source voltage VDDH and the gate of which is supplied with an inverted second addressing signal /SAET, a second PMOS transistor MP31 the source of which is supplied with the second source voltage VDDL and the gate of which is supplied with a first addressing signal SAEC, and an NMOS transistor MN30 the drain of which is connected to the drains of the first and second PMOS transistors MP30 and MP31, the gate of which is supplied with an inverted sensing enable signal /SAE and the source of which is supplied with the ground voltage VSS. The drains of the first and second PMOS transistors MP30 and MP31 and the drain of the NMOS transistor MN30 are connected to each other to supply the first control signal VTRUE.

The first addressing signal SAEC is generated at a logic low level when the memory cell 210 (see FIG. 2) connected to the bit line BL is selected, and generated at a logic high level when the memory cell 220 (see FIG. 2) connected to the complementary bit line BLB is selected. The second addressing signal SAET is generated at a logic high level when the memory cell 220 (see FIG. 2) connected to the complementary bit line BLB is selected, and generated at a logic low level when the memory cell 210 (see FIG. 2) connected to the bit line BL is selected. As the first addressing signal SAEC and the second addressing signal SAET, a least significant bit (LSB) address signal of address signals for selecting the memory cells 210, 220 is used.

FIG. 4 shows a second control signal (VCOMP) generating circuit, which comprises a first PMOS transistor MP40 the source of which is supplied with the first source voltage VDDH and the gate of which is supplied with a second addressing signal SAET, a second PMOS transistor MP41 the source of which is supplied with the second source voltage VDDL and the gate of which is supplied with an inverted first addressing signal /SAEC, and an NMOS transistor MN40 the drain of which is connected to the drains of the first and second PMOS transistors MP40 and MP41, the gate of which is supplied with an inverted sensing enable signal /SAE and the source of which is supplied with the ground voltage VSS. The drains of the first and second PMOS transistors MP40 and MP41 and the drain of the NMOS transistor MN40 are connected to each other to supply the second control signal VCOMP.

The first and second control signal generating circuits shown in FIGS. 3 and 4 operate in connection with operation of the bit-line sense amplifier 230 described above with reference to FIG. 2. That is, in a state where the NMOS transistors MN30 and MN40 are turned off in response to activation of the sensing enable signal SAE at a logic high level, when the first memory cell 210 is selected, the first addressing signal SAEC is generated at a logic low level and the second addressing signal SAET is generated at a logic low level. As a result, the first control signal VTRUE is generated at the second source voltage VDDL level, and the second control signal VCOMP is generated at the first source voltage VDDH level.

On the other hand, when the second memory cell 220 is selected, the first addressing signal SAEC is generated at a logic high level and the second addressing signal SAET is generated at a logic high level. As a result, the first control signal VTRUE is generated at the first source voltage VDDH level, and the second control signal VCOMP is generated at the second source voltage VDDL level.

That is, when the memory cell 210 connected to the bit line is selected, the second control signal VCOMP for switching the transistor MN2 connected to the complementary bit line BLB is activated at the first source voltage VDDH. When the memory cell 220 connected to the complementary bit line BLB is selected, the first control signal VTRUE for switching the transistor MN0 connected to the bit line BL is activated at the first source voltage VDDH level. This means that when the memory cell connected to the bit line BL or the complementary bit line BLB is selected, the transistor of the bit-line sense amplifier 230 oppositely connected to the complementary bit line BLB or the bit line BL is switched, that is, that the bit-line sense amplifier 230 has sensing directionality.

Figure 5:
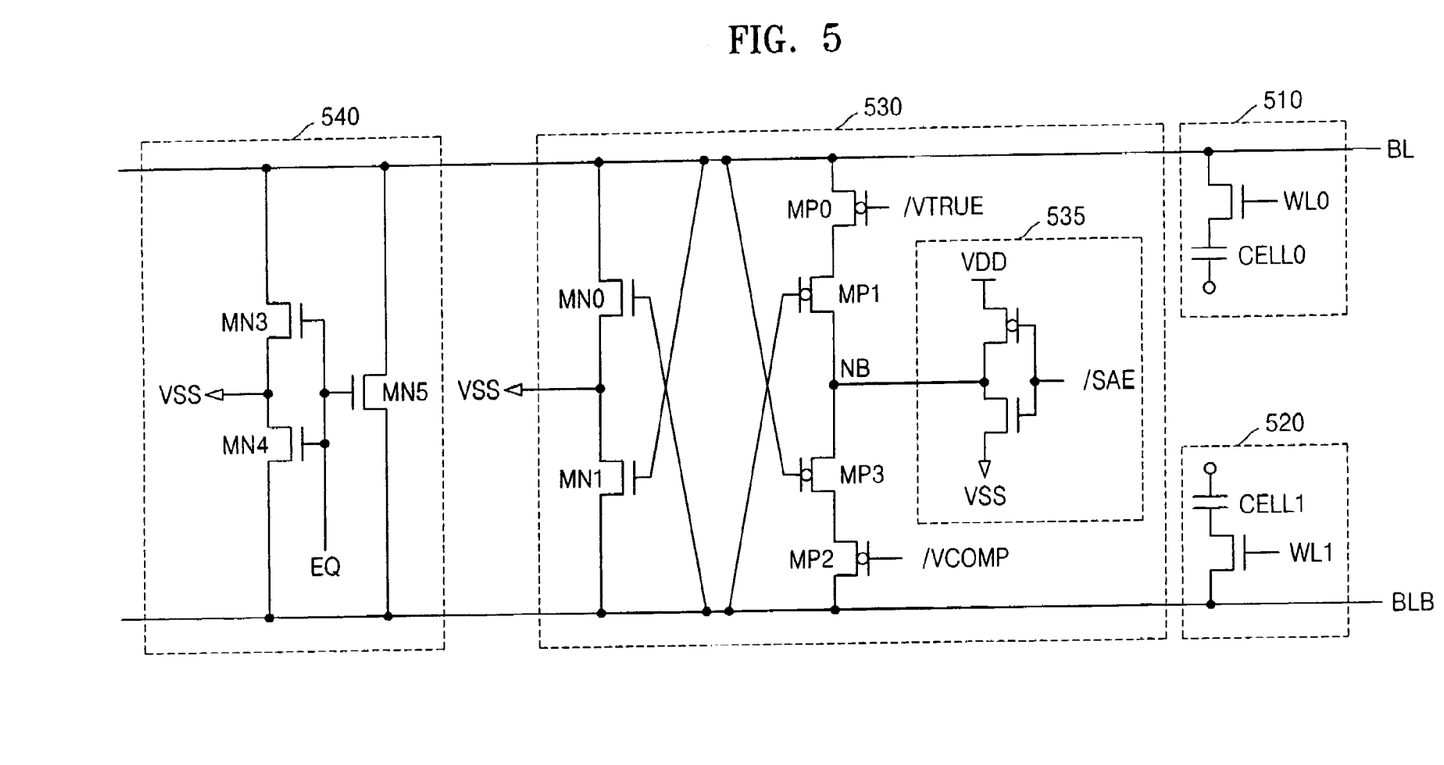
FIG. 5 illustrates a bit-line sense amplifier according to a second embodiment of the present invention.

FIG. 5 is a circuit diagram illustrating a bit-line sense amplifier according to a second embodiment of the present invention. Referring to FIG. 5, a bit-line sense amplifier 530 and a bit-line equalization circuit 540 are connected between a bit line BL connected to a first memory cell 510 and a complementary bit line BLB connected to a second memory cell 520. The bit-line equalization circuit 540 pre-charges the bit line BL and the complementary bit line BLB to the ground voltage VSS level in response to the bit-line equalizing signal EQ. The bit-line sense amplifier 530 enlarges the voltage difference between the bit line BL and the complementary bit line BLB to sense a data of the memory cell transferred to the bit line BL and the complementary bit line BLB pre-charged to the ground voltage VSS level.

The bit-line sense amplifier 530 comprises a sensing enable unit 535 which responds to a sense amplifier enable signal /SAE, first and second PMOS transistors MP0 and MP1 connected in series between the bit line BL and an output node NB of the sensing enable unit 535, third and fourth PMOS transistors MP2 and MP3 connected in series between the complementary bit line BLB and the output node NB of the sensing enable unit 535, and first and second NMOS transistors MN0 and MN1 of which the sources are supplied with a ground voltage VSS and the drains are connected to the bit line BL and the complementary bit line BLB, respectively.

The sensing enable unit 535 comprises an inverter to which the sense amplifier enable signal /SAE is input. The gates of the first NMOS transistor MN0 and the second PMOS transistor MP1 are connected to the complementary bit line BLB, and the gates of the second NMOS transistor MN1 and the fourth PMOS transistor MP3 are connected to the bit line BL. The gate of the first PMOS transistor MP0 is supplied with a first control signal /VTRUE, and the gate of the third PMOS transistor MP2 is supplied with a second control signal /VCOMP.

In the bit-line sense amplifier 530, corresponding to the selected memory cell, the first control signal /VTRUE is generated with a voltage level lower than that of the second control signal /VCOMP, or the second control signal /VCOMP is generated with a voltage level lower than that of the first control signal /VTRUE, and the output node NB of the sensing enable unit 535 turns into a power source voltage VDD level in response to activation of the sensing enable signal /SAE at a logic low level, so that voltage levels of the bit line BL and the complementary bit line BLB are amplified.

The bit-line equalization circuit 540 comprises fourth and fifth NMOS transistors MN3 and MN4 of which the sources are supplied with the ground voltage VSS and the drains are connected to the bit line BL and the complementary bit line BLB, respectively, and a sixth NMOS transistor MN5 connected between the bit line BL and the complementary bit line BLB. The gates of the fourth, fifth and sixth NMOS transistors MN3, MN4 and MN5 are supplied with an equalizing signal EQ. The bit line BL and the complementary bit line BLB are pre-charged to the ground voltage VSS level in response to activation of the equalizing signal EQ into a logic high level.

Figure 6:
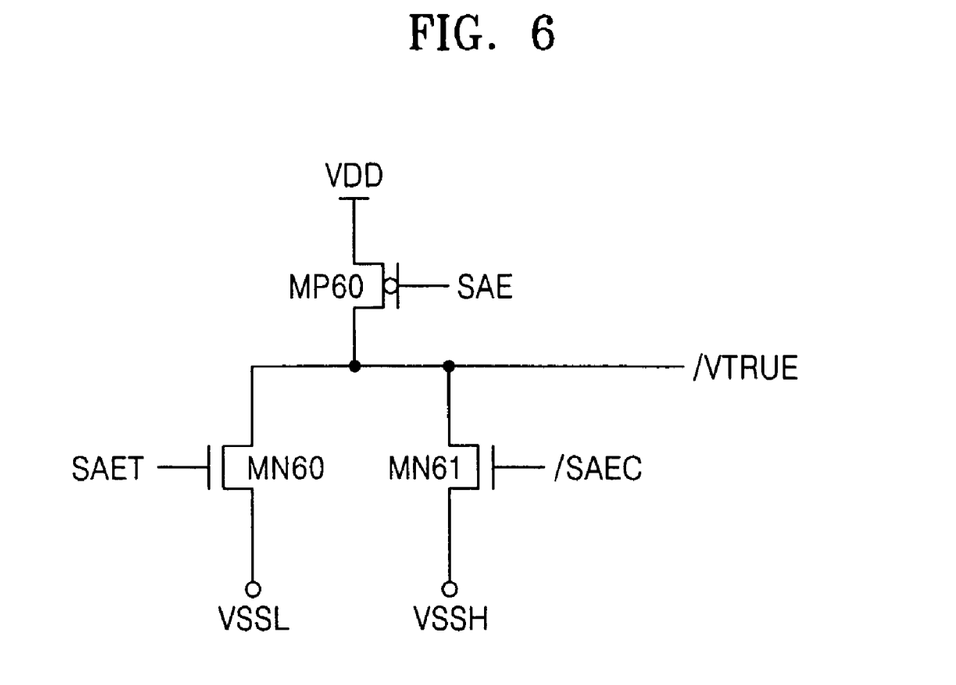
FIG. 6 illustrates a first control signal generating circuit for operating the bit-line sense amplifier shown in FIG. 5.
Figure 7:
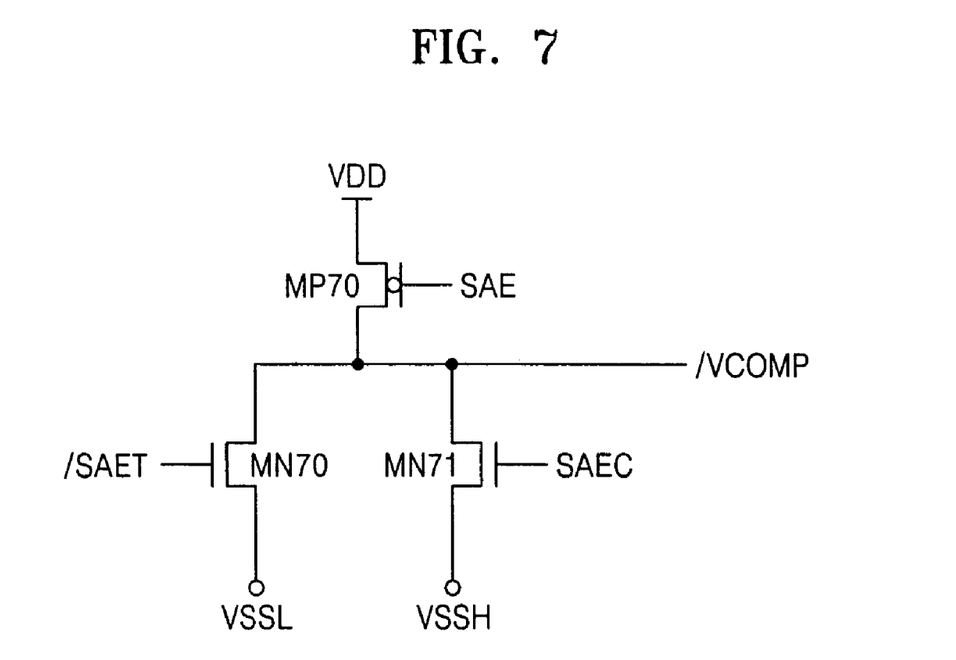
FIG. 7 illustrates a second control signal generating circuit for operating the bit-line sense amplifier shown in FIG. 5.

The first control signal /VTRUE and the second control signal NCOMP are supplied from control signal generating circuits shown in FIGS. 6 and 7, respectively.

FIG. 6 shows a first control signal (NTRUE) generating circuit, which comprises a first NMOS transistor MN60 the source of which is supplied with a second ground voltage VSSL and the gate of which is supplied with an second addressing signal SAET, a second NMOS transistor MN61 the source of which is supplied with a first ground voltage VSSH and the gate of which is supplied with an inverted first addressing signal /SAEC, and an PMOS transistor MP60 the drain of which is connected to the drains of the first and second NMOS transistors MN60 and MN61, the gate of which is supplied with an inverted sensing enable signal SAE and the source of which is supplied with the power source voltage VDD. The drains of the first and second NMOS transistors MN60 and MN61 and the drain of the PMOS transistor MP60 are connected to each other to supply the first control signal /VTRUE.

FIG. 7 shows a second control signal (/VCOMP) generating circuit, which comprises a first NMOS transistor MN70 the source of which is supplied with the second ground voltage VSSL and the gate of which is supplied with an inverted second addressing signal /SAET, a second NMOS transistor MN71 the source of which is supplied with the first ground voltage VSSH and the gate of which is supplied with a first addressing signal SAEC, and a PMOS transistor MP70 the drain of which is connected to the drains of the first and second NMOS transistors MN70 and MN71, the gate of which is supplied with an inverted sensing enable signal SAE and the source of which is supplied with the power source voltage VDD. The drains of the first and second NMOS transistors MN70 and MN71 and the drain of the PMOS transistor MP70 are connected to each other to supply the second control signal /VCOMP.

When the first memory cell 510 is selected, the inverted first addressing signal /SAEC is generated at a logic high level and the inverted second addressing signal /SAET is generated at a logic high level, so that the first control signal /VTRUE is generated at the first ground voltage VSSH level and the second control signal /VCOMP is generated at the second ground voltage VSSL level. When the second memory cell 520 is selected, the second addressing signal SAET is generated at a logic high level and the first addressing signal SAEC is generated at a logic high level, so that the first control signal /VTRUE is generated at the second ground voltage VSSL level and the second control signal /VCOMP is generated at the first ground voltage VSSH level. Here, the second ground voltage VSSL is set to a voltage level lower than the first ground voltage VSSH.

The bit-line sense amplifier 530 according to this embodiment operates in accordance with the following. First, the bit line BL and the complementary bit line BLB are pre-charged to the ground voltage VSS level by means of the bit-line equalization circuit 540.

First, in a case where data stored in the first memory cell 510 is a logic "1", when the first word line WL0 is enabled, the data "1" of the first memory cell 510 is transferred to the bit line BL, so that the voltage level of the bit line BL is slightly raised from the ground voltage VSS level. The second control signal /VCOMP is activated at the second ground voltage VSSL level to turn on the third PMOS transistor MP2, and the first control signal NTRUE is activated at the first ground voltage VSSH level to turn on the first PMOS transistor MP0. The output node NB of the sensing enable unit 535 turns into the power source voltage VDD level in response to activation of the sensing enable signal SAE into a logic high level.

The voltage level of the bit line BL is slightly raised from the ground voltage VSS level due to the cell data "1" transferred to the bit line BL. Accordingly, the fourth PMOS transistor MP3 is slightly turned on, and the second PMOS transistor MP1 the gate of which is connected to the complementary bit line BLB pre-charged to the ground voltage VSS level is turned on, so that an intensive current path toward the output node NB of the sensing enable unit 535 having the power source voltage VDD level through the turned-on first PMOS transistor MP0 and the second PMOS transistor MP1 from the bit line BL is formed. Therefore, the bit line BL turns into the power source voltage VDD level to turn off the fourth PMOS transistor MP3, so that the bit line BL turns into the power source voltage VDD and the complementary bit line BLB turns into the ground voltage VSS level. As a result, a voltage difference between the bit line BL and the complementary bit line BLB becomes large.

Second, in a case where data stored in the first memory cell 510 is "0", when the first word line WL0 is enabled, the data "0" of the first memory cell 510 is transferred to the bit line BL. The second control signal /VCOMP is activated at the second ground voltage VSSL level to turn on the third PMOS transistor MP2, and the first control signal /VTRUE is activated at the first ground voltage VSSH level to turn on the first PMOS transistor MP0. Thereafter, in response to activation of the sensing enable signal SAE into a logic high level, the output node NB of the sensing enable unit 535 turns into the power source voltage VDD level.

In response to the ground voltage VSS level of the bit line BL, the fourth PMOS transistor MP3 is turned on, and the third NMOS transistor MN2 the gate of which is supplied with the second control signal NCOMP having the second ground voltage VSSL level is turned on, so that an intensive current path toward the output node NB of the sensing enable unit 535 having the power source voltage VDD level is formed from the complementary bit line BLB. Accordingly, the complementary bit line BLB is raised to the power source voltage VDD level to turn off the second PMOS transistor MP1. Therefore, the bit line BL holds the ground voltage VSS level, and the complementary bit line BLB turns into the power source voltage VDD level, so that a voltage difference between the bit line BL and the complementary bit line BLB becomes large.

Therefore, in the bit-line sense amplifier according to this embodiment, when the memory cell 510 connected to the bit line BL is selected, the second control signal /VCOMP for switching the transistor MP2 connected to the complementary bit line BLB is activated at the second ground voltage VSSL level. When the memory cell 520 connected to the complementary bit line BLB is selected, the first control signal /VTRUE for switching the transistor MP0 connected to the bit line BL is activated at the second ground voltage VSSL level. This means that when the memory cell connected to the bit line BL or the complementary bit line BLB is selected, the transistor of the bit-line sense amplifier 530 oppositely connected to the complementary bit line BLB or the bit line BL is switched, that is, that the bit-line sense amplifier 530 has sensing directionality.

While the present invention has been particularly shown and described with reference to exemplary embodiments thereof, it will be understood by those skilled in the art that various changes in form and details may be made therein without departing from the spirit and scope of the present invention as defined by the following claims.

What is claimed is:

1. A memory device comprising:
   first memory cells connected to a bit line;
   second memory cells connected to a complementary bit line;
   a bit-line equalization circuit which pre-charges the bit line and the complementary bit line to a power source voltage level;
   a sensing enable unit which changes the voltage at its output node to a ground voltage level in response to a sensing enable signal; and
   a bit-line sense amplifier in which when the first memory cells connected to the bit line are selected, a second addressing signal for selecting the second memory cells connected to the complementary bit line is generated with a voltage level higher than that of a first addressing signal for selecting the first memory cells connected to the bit line, thereby amplifying a voltage level of the bit line and a voltage level of the complementary bit line using a first current path and a second current path,
   wherein the first current path is formed between the output node of the sensing enable unit and the bit line in response to the voltage level of the complementary bit line and the first addressing signal, and the second current path is formed between the output node of the sensing enable unit and the complementary bit line in response to the voltage level of the bit line and the second addressing signal.

2. The memory device according to claim 1, wherein when the second memory cells connected to the complementary bit line are selected, the first addressing signal is generated with a voltage level higher than that of the second addressing signal, thereby amplifying the voltage level of the bit line and the voltage level of the complementary bit line using the first current path and the second current path.

3. The memory device according to claim 1, wherein the sensing enable unit is an inverter comprising a PMOS transistor and an NMOS transistor connected in series between the power source voltage and the ground voltage, the gates of the PMOS and NMOS transistors being supplied with the sensing enable signal.

4. The memory device according to claim 1, wherein the bit-line sense amplifier comprises:
   a first PMOS transistor the source of which is supplied with the power source voltage, the drain of which is connected to the bit line, and the gate of which is connected to the complementary bit line;
   a second PMOS transistor the source of which is supplied with the power source voltage, the drain of which is connected to the complementary bit line, and the gate of which is connected to the bit line;

first and second NMOS transistors connected in series between the bit line and the output node of the sensing enable unit, the gate of the first NMOS transistor being supplied with a first control signal which is activated when the memory cells connected to the complementary bit line are selected, the gate of the second NMOS transistor being connected to the complementary bit line; and third and fourth NMOS transistors connected in series between the complementary bit line and the output node of the sensing enable unit, the gate of the third NMOS transistor being supplied with a second control signal which is activated when the memory cells connected to the bit line are selected, the gate of the fourth NMOS transistor being connected to the bit line.

5. The memory device according to claim 4, wherein the first control signal is generated from a first control signal generating circuit, and the first control signal generating circuit comprises:

a third PMOS transistor the source of which is supplied with a first source voltage having a voltage level higher than a second source voltage, and the gate of which is supplied with an inverted signal of the second addressing signal;

a fourth PMOS transistor the source of which is supplied with the second source voltage, and the gate of which is supplied with the first addressing signal; and a fifth NMOS transistor the source of which is supplied with the ground voltage, the gate of which is supplied with the sensing enable signal, and the drain of which is connected to the drains of the third and fourth PMOS transistors.

6. The memory device according to claim 4, wherein the second control signal is generated from a second control signal generating circuit, and the second control signal generating circuit comprises:

a third PMOS transistor the source of which is supplied with the first source voltage having a voltage level higher than a second source voltage, and the gate of which is supplied with the second addressing signal;

a fourth PMOS transistor the source of which is supplied with the second source voltage, and the gate of which is supplied with an inverted signal of the first addressing signal; and fifth NMOS transistor the source of which is supplied with the ground voltage, the gate of which is supplied with the sensing enable signal, and the drain of which is connected to the drains of the third and fourth PMOS transistors.

7. A memory device comprising:

first memory cells connected to a bit line;

second memory cells connected to a complementary bit line;

a bit-line equalization circuit which pre-charges the bit line and the complementary bit line to a ground voltage level;

a sensing enable unit which changes the voltage at its output node to a power source voltage level in response to a sensing enable signal; and a bit-line sense amplifier in which when the first memory cells connected to the bit line are selected, a second addressing signal for selecting the second memory cells connected to the complementary bit line is generated with a voltage level lower than that of a first addressing signal for selecting the first memory cells connected to the bit line, thereby amplifying a voltage level of the bit line and a voltage level of the complementary bit line using a first current path and a second current path, wherein the first current path is formed between the output node of the sensing enable unit and the bit line in response to the voltage level of the complementary bit line and the first addressing signal, and the second current path is formed between the output node of the sensing enable unit and the complementary bit line in response to the voltage level of the bit line and the second addressing signal.

8. The memory device according to claim 7, wherein when the second memory cells connected to the complementary bit line are selected, the first addressing signal is generated with a voltage level lower than that of the second addressing signal, thereby amplifying the voltage level of the bit line and the voltage level of the complementary bit line using the first current path and the second current path.

9. The memory device according to claim 7, wherein the sensing enable unit is an inverter comprising a PMOS transistor and an NMOS transistor connected in series between the power source voltage and the ground voltage, the gates of the PMOS and NMOS transistors being supplied with the sensing enable signal.

10. The memory device according to claim 7, wherein the bit-line sense amplifier comprises:

a first NMOS transistor the source of which is supplied with the ground voltage, the drain of which is connected to the bit line, and the gate of which is connected to the complementary bit line;

a second NMOS transistor the source of which is supplied with the ground voltage, the drain of which is connected to the complementary bit line, and the gate of which is connected to the bit line;

first and second PMOS transistors connected in series between the bit line and the output node of the sensing enable unit, the gate of the first PMOS transistor being supplied with a first control signal which is activated when the memory cells connected to the complementary bit line are selected, the gate of the second PMOS transistor being connected to the complementary bit line; and third and fourth PMOS transistors connected in series between the complementary bit line and the output node of the sensing enable unit, the gate of the third PMOS transistor being supplied with a second control signal which is activated when the memory cells connected to the bit line are selected, the gate of the fourth PMOS transistor being connected to the bit line.

11. The memory device according to claim 10, wherein the first control signal is generated from a first control signal generating circuit, and the first control signal generating circuit comprises:

a third NMOS transistor the source of which is supplied with a second ground voltage having a voltage level lower than a first ground voltage, and the gate of which is supplied with the second addressing signal;

a fourth NMOS transistor the source of which is supplied with the first ground voltage, and the gate of which is supplied with the inverted first addressing signal; and a fifth PMOS transistor the source of which is supplied with the power source voltage, the gate of which is supplied with the inverted sensing enable signal, and the drain of which is connected to the drains of the third and fourth NMOS transistors.

12. The memory device according to claim 10, wherein the second control signal is generated from a second control signal generating circuit, and the second control signal generating circuit comprises:
- a third NMOS transistor the source of which is supplied with a second ground voltage having a voltage level lower than a first ground voltage, and the gate of which is supplied with the second addressing signal;
- a fourth NMOS transistor the source of which is supplied with the first ground voltage, and the gate of which is supplied with an inverted signal of the first addressing signal; and
- a fifth PMOS transistor the source of which is supplied with the power source voltage, the gate of which is supplied with the inverted sensing enable signal, and the drain of which is connected to the drains of the third and fourth NMOS transistors.

13. A method of amplifying voltage levels of a bit line and a complementary bit line of a memory device, the method comprising steps of:
- (a) pre-charging the bit line and the complementary bit line to a power source voltage level;
- (b) enabling first memory cells connected to the bit line to transfer data of the first memory cells to the bit line; and
- (c) allowing an output node of a sensing enable unit to have a ground voltage level in response to a sensing enable signal, wherein step (b) comprises:
- (b-1) generating a second addressing signal for selecting second memory cells connected to the complementary bit line with a voltage level higher than that of a first addressing signal for selecting the first memory cells; and
- (b-2) amplifying the voltage level of the bit line and the voltage level of the complementary bit line using a first current path and a second current path, the first current path being formed between the output node of the sensing enable unit and the bit line in response to the voltage level of the complementary bit line and the first addressing signal, the second current path being formed between the output node of the sensing enable unit and the complementary bit line in response to the voltage level of the bit line and the second addressing signal.

14. The method according to claim 13, further comprising (d) enabling the second memory cells connected to the complementary bit line to transfer data of the second memory cells to the complementary bit line, wherein step (d) comprises:
- (d-1) generating the first addressing signal with a voltage level higher than that of the second addressing signal; and
- (d-2) amplifying the voltage level of the bit line and the voltage level of the complementary bit line by using the first current path and the second current path.

15. A method of amplifying voltage levels of a bit line and a complementary bit line of a memory device, the method comprising:
- (a) pre-charging the bit line and the complementary bit line to a ground voltage level;
- (b) enabling first memory cells connected to the bit line to transfer data of the first memory cells to the bit line; and
- (c) allowing an output node of a sensing enable unit to have a power source voltage level in response to a sensing enable signal, wherein step (b) comprises:
- (b-1) generating a second addressing signal for selecting second memory cells connected to the complementary bit line with a voltage level lower than that of a first addressing signal for selecting the first memory cells; and
- (b-2) amplifying the voltage level of the bit line and the voltage level of the complementary bit line using a first current path and a second current path, the first current path being formed between the output node of the sensing enable unit and the bit line in response to the voltage level of the complementary bit line and the first addressing signal, the second current path being formed between the output node of the sensing enable unit and the complementary bit line in response to the voltage level of the bit line and the second addressing signal.

16. The method according to claim 15, further comprising (d) enabling the second memory cells connected to the complementary bit line to transfer data of the second memory cells to the complementary bit line, wherein step (d) comprises:
- (d-1) generating the first addressing signal with a voltage level lower than that of the second addressing signal; and
- (d-2) amplifying the voltage level of the bit line and the voltage level of the complementary bit line by using the first current path and the second current path.

* * * * *